US010243119B2

(12) United States Patent
Oh

(10) Patent No.: US 10,243,119 B2
(45) Date of Patent: Mar. 26, 2019

(54) LIGHT-EMITTING DEVICE PACKAGE, DISPLAY APPARATUS AND LIGHTING APPARATUS COMPRISING SAME

(71) Applicant: LG INNOTEK CO., LTD., Seoul (KR)

(72) Inventor: Sung Joo Oh, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/033,307

(22) PCT Filed: Oct. 20, 2014

(86) PCT No.: PCT/KR2014/009823

§ 371 (c)(1),
(2) Date: Apr. 29, 2016

(87) PCT Pub. No.: WO2015/064941

PCT Pub. Date: May 7, 2015

(65) Prior Publication Data

US 2016/0284955 A1 Sep. 29, 2016

(30) Foreign Application Priority Data

Oct. 30, 2013 (KR) ........................ 10-2013-0130221

(51) Int. Cl.
*H01L 33/58* (2010.01)
*G02B 6/00* (2006.01)
*H01L 25/075* (2006.01)

(52) U.S. Cl.
CPC ................ *H01L 33/58* (2013.01); *G02B 6/00* (2013.01); *H01L 25/0753* (2013.01); *H01L 2924/0002* (2013.01)

(58) Field of Classification Search
CPC ........ G02F 2001/133607; G02B 6/002; G02B 6/0033; G02B 27/095–27/0972;
(Continued)

(56) References Cited

U.S. PATENT DOCUMENTS 7,222,995 B1 * 5/2007 Bayat ...................... F21L 4/027 359/728
7,458,703 B2 12/2008 Han et al.
(Continued)

FOREIGN PATENT DOCUMENTS

JP 5025612 B2 9/2012
KR 10-2006-0034021 A 4/2006
(Continued)

OTHER PUBLICATIONS

English version of Kim KR20130081867(A) (attached).*

*Primary Examiner* — Eric A. Ward
*Assistant Examiner* — Eric K Ashbahian
(74) *Attorney, Agent, or Firm* — Birch, Stewart, Kolasch & Birch, LLP

(57) ABSTRACT

A light-emitting device package according to an embodiment comprises lenses arranged in and on a light-emitting device. The lenses comprise an upper surface including a recessed part; a groove part arranged on one or more areas of the upper surface; a bottom surface facing the light-emitting device; a supporting part arranged on the bottom surface; and an outer surface that is slanted with respect to the bottom surface and that contacts the groove part, wherein the groove part is arranged more outwardly from the lens than the support part relative to the light-emitting device.

10 Claims, 5 Drawing Sheets

(58) Field of Classification Search
CPC ... G02B 3/0037; G02B 27/0955; F21V 13/04; F21V 5/04; F21V 5/045; F21V 7/0091; F21V 5/02; H01L 33/58; H01L 33/54; F21K 9/69; F21Y 2101/02; F21S 41/285
See application file for complete search history.

(56) References Cited

U.S. PATENT DOCUMENTS

| | | | | |
|---|---|---|---|---|
| 7,549,781 | B2 * | 6/2009 | Kim | G02B 19/0066 362/311.01 |
| 8,118,457 | B2 * | 2/2012 | Kanai | F21V 5/04 362/327 |
| 8,585,239 | B1 * | 11/2013 | Tseng | F21V 5/04 362/244 |
| 2006/0044806 | A1 * | 3/2006 | Abramov | F21V 5/007 362/337 |
| 2006/0083000 | A1 | 4/2006 | Yoon et al. | |
| 2007/0217195 | A1 * | 9/2007 | Chen | H01L 33/58 362/255 |
| 2011/0089453 | A1 * | 4/2011 | Min | F21V 5/04 257/98 |
| 2011/0116272 | A1 * | 5/2011 | Bak | F21V 5/04 362/296.01 |
| 2011/0222294 | A1 * | 9/2011 | Fan | F21V 5/04 362/296.01 |
| 2014/0056007 | A1 * | 2/2014 | Chou | F21V 13/04 362/308 |
| 2014/0204563 | A1 * | 7/2014 | Nguyen | F21V 5/04 362/97.1 |
| 2015/0001562 | A1 * | 1/2015 | Han | H01L 33/58 257/98 |

FOREIGN PATENT DOCUMENTS

| | | | |
|---|---|---|---|
| KR | 10-2009-0120860 | A | 11/2009 |
| KR | 10-2013-0045098 | A | 5/2013 |
| KR | 10-2013-0062005 | A | 6/2013 |
| KR | 10-2013-0081867 | A | 7/2013 |
| WO | WO 2013/081417 | A1 | 6/2013 |

* cited by examiner

【Fig. 1a】
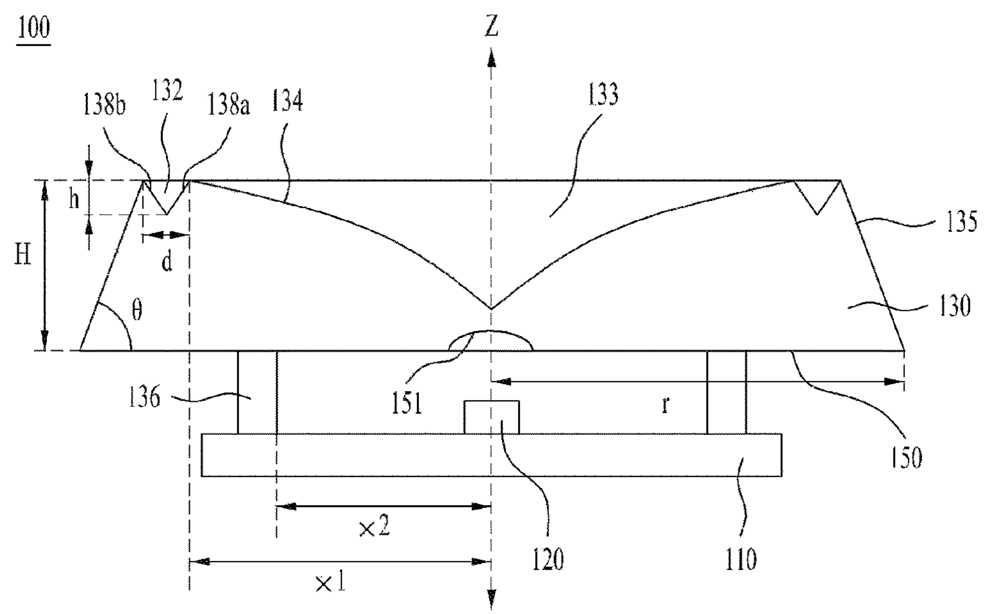
【Fig. 1b】
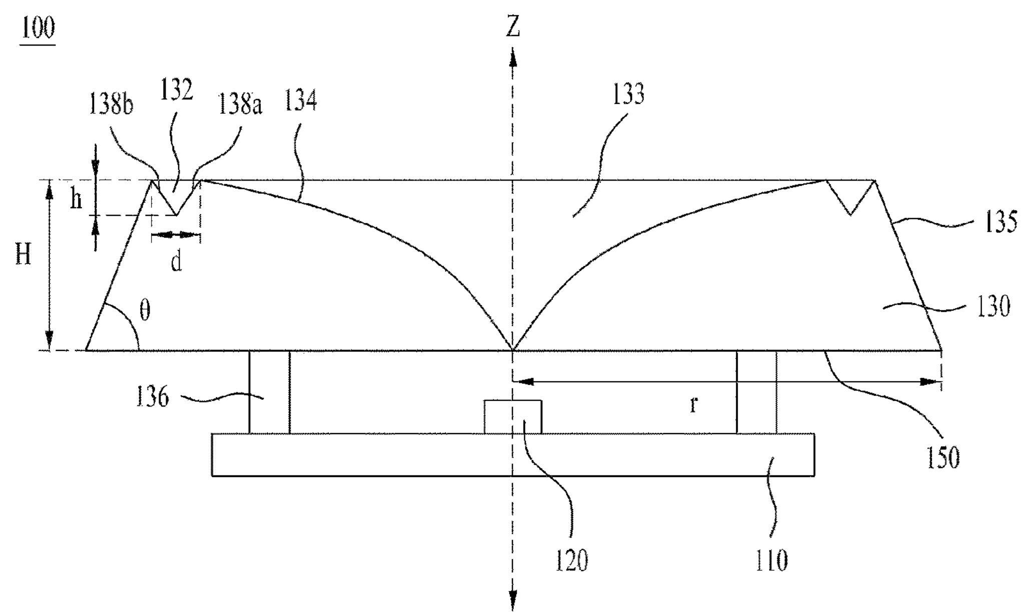

【Fig. 2】
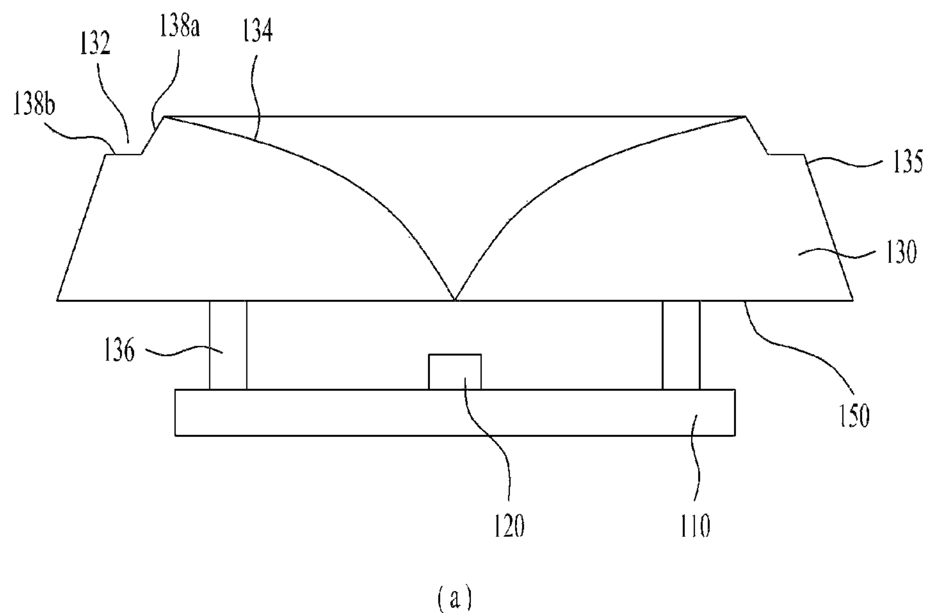
(a)
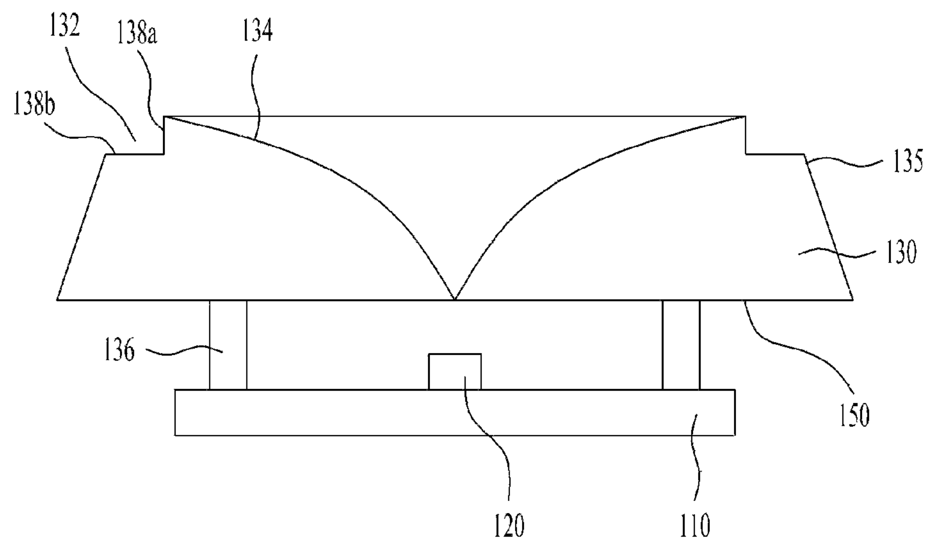
(b)

【Fig. 3】
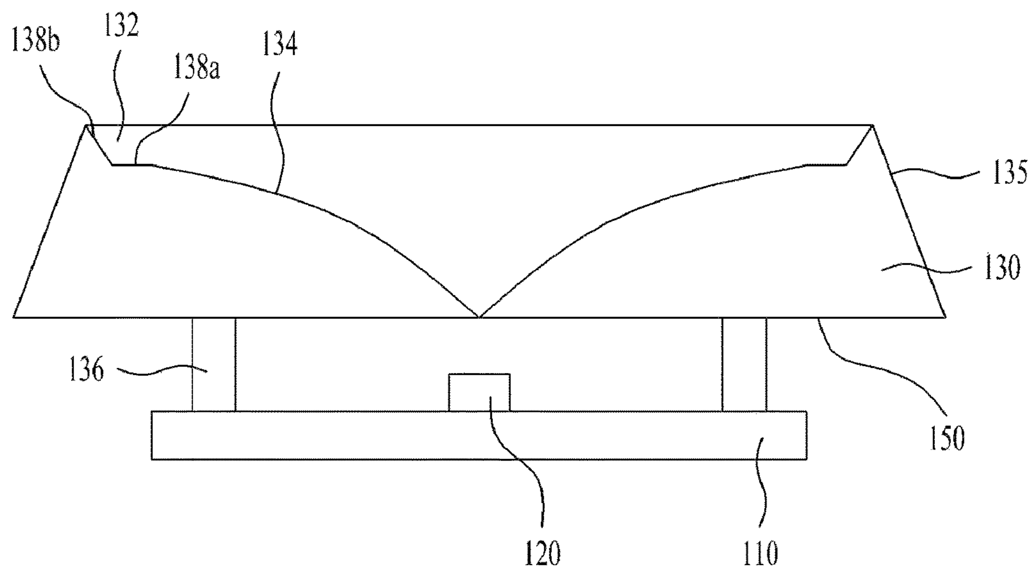
【Fig. 4】
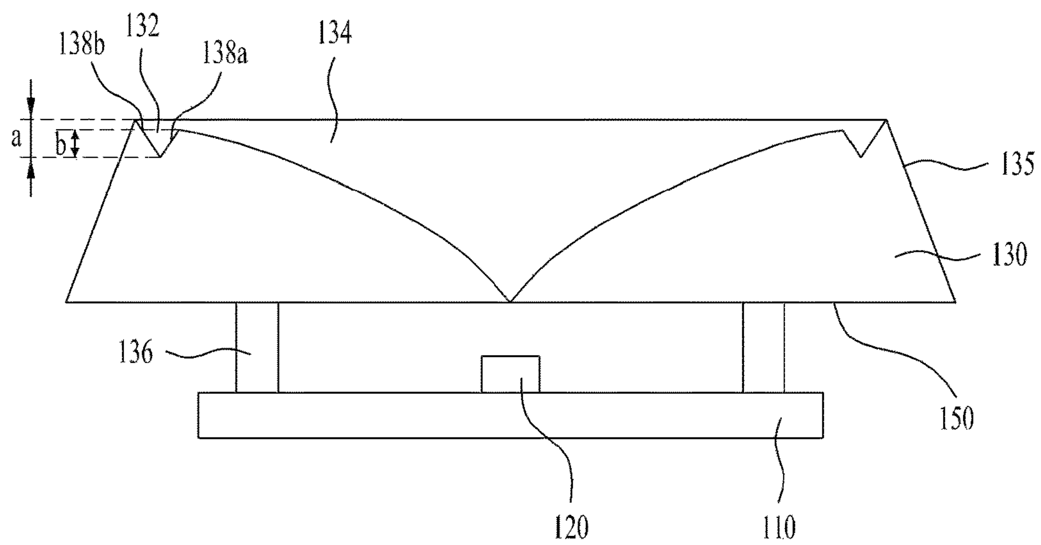

【Fig. 5】
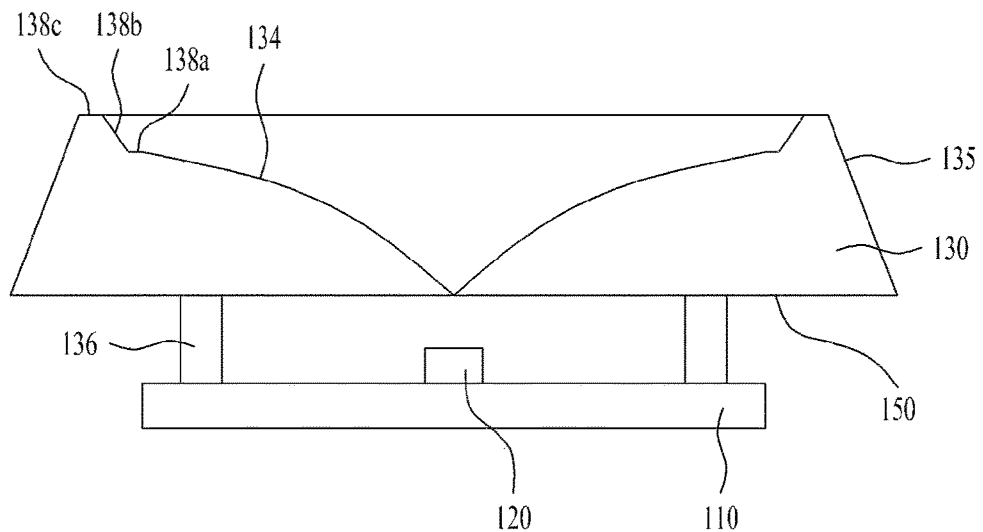
【Fig. 6】
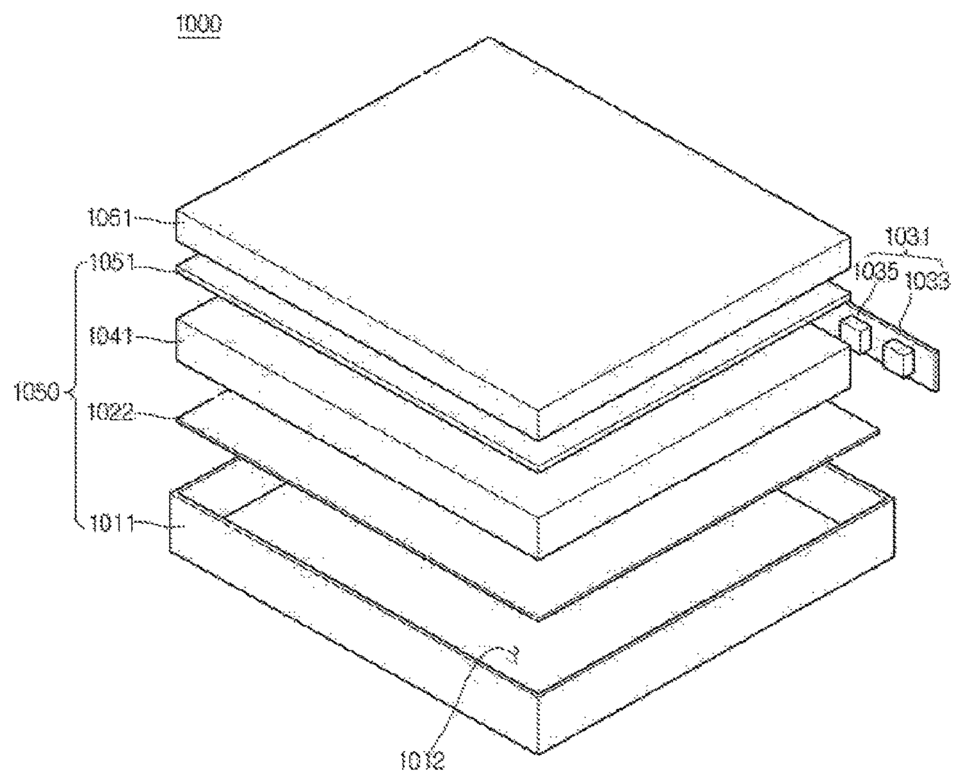

【Fig. 7】
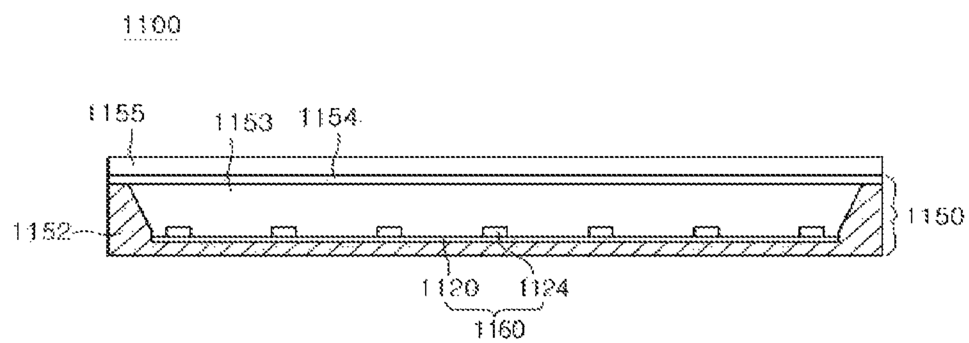
【Fig. 8】
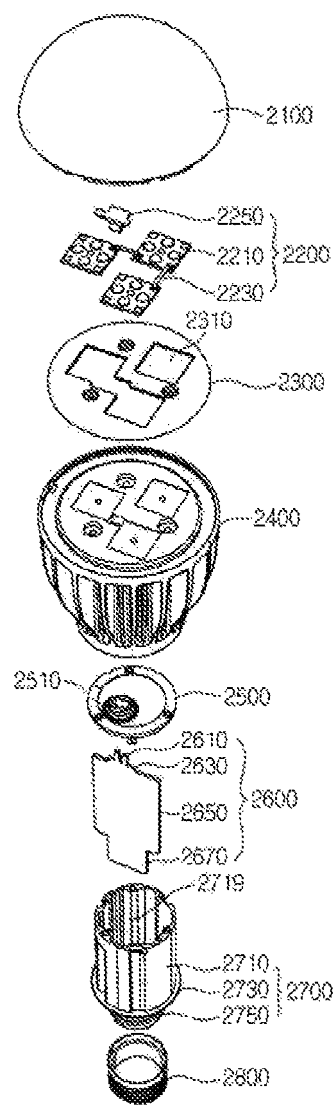

LIGHT-EMITTING DEVICE PACKAGE, DISPLAY APPARATUS AND LIGHTING APPARATUS COMPRISING SAME

CROSS REFERENCE TO RELATED APPLICATIONS

This application is the National Phase of PCT International Application No. PCT/KR2014/009823, filed on Oct. 20, 2014, which claims priority under 35 U.S.C. 119(a) to Patent Application No. 10-2013-0130221, filed in the Republic of Korea on Oct. 30, 2013, all of which are hereby expressly incorporated by reference into the present application.

TECHNICAL FIELD

Embodiments relate to a light-emitting device and to a display apparatus and a lighting apparatus each including the same.

BACKGROUND ART

A light-emitting diode (LED), which is a device for converting an electric signal into light using the properties of a compound semiconductor, is used in household electric appliances, remote controls, electric signs, displays, various automatic apparatuses and the like, and the fields of application thereof are continually broadening.

When a forward voltage is applied to a light-emitting device, an electron in an n-type layer combines with a hole in a p-type layer, whereby energy corresponding to the energy gap between the conduction band and the valence band of the electron is generated. Here, the energy is dominantly generated in the form of heat or light, and is generated in the form of light in the case of an LED.

Nitride semiconductors are attracting a lot of attention in the developing area of photonic devices and high output electron elements owing to their high thermal stability and wide band gap. In particular, a blue light-emitting device, a green light-emitting device, an UV light-emitting device and the like, which employ nitride semiconductors, have been commercialized, and are extensively used.

A light-emitting device package may be manufactured in such a way that a light-emitting device is produced on a board, the light-emitting device is separated into individual light-emitting device chips through a die separation process, the light-emitting device chip is bonded to a package body through a die bonding process, wire bonding and molding processes are performed, and a test is performed.

In the manufacture, since the process of producing the light-emitting device chips and a packaging process are separately performed, the manufacturing process may cause problems whereby various complicated processes and a wide variety of boards are required.

Light-emitting device packages are classified into a structure in which a light-emitting device and a lead frame are disposed in a packaging body, and a lens-type structure, in which a light-emitting device is disposed on a lead frame and a lens structure is formed on the light-emitting device.

DISCLOSURE

Technical Problem

Embodiments provide a light-emitting device package and a display apparatus and a lighting system each including the same, in which a lens is configured to have such a form as to minimize a phenomenon whereby light is concentrated on only a portion of the upper part of the lens.

Technical Solution

A light-emitting device package according to an embodiment includes a light-emitting device, and a lens disposed on the light-emitting device, wherein the lens includes an upper surface having a first recess, a groove formed in at least a portion of the upper surface, a bottom surface facing the light-emitting device, a support disposed on the bottom surface; and a lateral side surface inclined with respect to the bottom surface and contacting the groove, wherein the groove is disposed at an outer region of the lens of the lens, which is located at a position further outward than the support from the light-emitting device.

Advantageous Effects

A light-emitting device package according to an embodiment of the present invention is able to maximize the emission of light by forming a recess in the upper surface of a lens.

A light-emitting device package according to an embodiment of the present invention is able to prevent light from being excessively emitted from the upper end of the upper surface of the package by providing a groove in the upper end of the upper surface of the package, thereby reducing the phenomenon whereby light is concentrated on only a portion of the upper part of the package.

A light-emitting device package according to an embodiment of the present invention is able to continuously reduce light up to the region on which light is most intensively concentrated and thus to reduce the discontinuity of emitted light by forming an inclined surface, which is increased in height moving in an outward direction of a lens.

DESCRIPTION OF DRAWINGS

FIGS. 1*a* to 5 are cross-sectional views illustrating light-emitting device packages according to a plurality of embodiments;

FIG. 6 is an exploded perspective view illustrating a display apparatus including the light-emitting device package according to an embodiment;

FIG. 7 is a view illustrating a display apparatus including the light-emitting device package according to an embodiment; and FIG. 8 is an exploded perspective view illustrating a light-emitting apparatus including the light-emitting device package according to an embodiment.

BEST MODE

Reference will now be made in detail to embodiments, examples of which are illustrated in the accompanying drawings. However, the present disclosure may be embodied in many different forms and should not be construed as limited to the embodiments set forth herein. Rather, these embodiments are provided so that this disclosure will be thorough and complete, and will fully convey the scope of the disclosure to those skilled in the art. The present disclosure is defined only by the categories of the claims. In certain embodiments, detailed descriptions of device constructions or processes well known in the art may be omitted in order to avoid obscuring appreciation of the disclosure by a person of ordinary skill in the art. Wherever possible, the same reference numbers will be used throughout the drawings to refer to the same or like parts.

Spatially relative terms such as “below”, “beneath”, “lower”, “above”, or “upper” may be used herein to describe one element’s relationship to another element as illustrated in the Figures. It will be understood that spatially relative terms are intended to encompass different orientations of the device in addition to the orientations depicted in the Figures. For example, if the device in one of the figures is turned over, elements described as “below” or “beneath” other elements would then be oriented above the other elements. The exemplary terms “below” or “beneath” can, therefore, encompass both the orientation of above and below. Since the device may be oriented in another direction, the spatially relative terms may be interpreted in accordance with the orientation of the device.

The terminology used in the present disclosure is for the purpose of describing particular embodiments only and is not intended to limit the disclosure. As used in the disclosure and the appended claims, the singular forms “a”, “an” and “the” are intended to include the plural forms as well, unless the context clearly indicates otherwise. It will be further understood that the terms “comprises” and/or “comprising,” when used in this specification, specify the presence of stated components, steps, operations and/or elements, but do not preclude the presence or addition of other components, steps, operations and/or elements.

In the drawings, the thickness or size of each layer is exaggerated, omitted, or schematically illustrated for convenience of description and clarity. Also, the size or area of each constituent element does not entirely reflect the actual size thereof.

Angles or directions used to describe the structures of light-emitting devices according to embodiments are based on those shown in the drawings. Unless there is, in the specification, no definition of a reference point to describe angular positional relationships in the structures of the light-emitting devices, the associated drawings may be referred to.

Hereinafter, embodiments will be described in detail with reference to the accompanying drawings.

FIGS. 1*a* and 1*b* are cross-sectional views illustrating light-emitting device packages 100 according to embodiments.

Referring to FIGS. 1*a* and 1*b*, the light-emitting device packages 100 according to an embodiment may include a light-emitting device 120 and a lens 130 disposed above the light-emitting device 120. The lens 130 may include an upper surface 134, a bottom surface and a lateral side surface 135.

The upper surface 134 of the lens 130 may have a first recess 133, and the upper surface 134 may be provided in at least a portion thereof with a groove 132. The groove 132 of the lens 130 may be disposed outside a support 136 with respect to the light-emitting device 120.

The bottom surface 150 of the lens 130 may be the surface that faces the light-emitting device 120, and the support 136 may be disposed on the bottom surface 150 of the lens 130. The lateral side surface 135 may be inclined with respect to the bottom surface 150 of the lens 130, and may be formed so as to contact the groove 132 in the upper surface 134 of the lens 130.

The light-emitting device package 100 according to the embodiment may include a board 110.

For example, the board 110 may include an electrode pattern for supplying power to the light-emitting device 120 disposed on the board 110. The electrode pattern (not shown) may be electrically connected to the light-emitting device 120. The board 110 may be a printed circuit board (PCB) or a metal-core printed circuit board (MPCB). Although the board 110 may be of a hard type so as to support the light-emitting device package, the disclosure is not limited thereto, and a flexible-type board may also be used.

The light-emitting device 120 may emit light.

The light-emitting device 120 may be disposed on the board 110. The light-emitting device 120 may be disposed below the lens 130, and light emitted from the light-emitting device 120 may be supplied to the lens 130.

The light-emitting device 120 may include a first conductivity-type semiconductor layer, a second conductivity-type semiconductor layer and an active layer.

The first conductivity-type semiconductor layer may include, for example, a semiconductor material having a composition formula of InxAlyGa1−x−yN ($0 \le x \le 1$, $0 \le y \le 1$, $0 \le x+y \le 1$). The first conductivity-type semiconductor layer may be composed of at least one of GaN, InN, AlN, InGaN, AlGaN, InAlGaN, AlInN, AlGaAs, InGaAs, AlInGaAs, GaP, AlGaP, InGaP, AlInGaP and InP. Although the first conductivity-type semiconductor layer may include, for example, an n-type dopant such as Si, Ge, Sn, Se or Te, the disclosure is not limited thereto.

Although the active layer may have a single or multi quantum well structure including a quantum well layer having a composition formula of InaAlbGa1−a−bN ($0 \le a \le 1$, $0 \le b \le 1$, $0 \le a+b \le 1$) and a barrier layer having a composition formula of InaAlbGa1−a−bN ($0 \le a \le 1$, $0 \le b \le 1$, $0 \le a+b \le 1$), the disclosure is not limited thereto. The quantum well layer may be made of a material having a smaller band gap than the barrier layer.

The second conductivity-type semiconductor layer may include a semiconductor material having a composition formula of InxAlyGa1−x−yN ($0 \le x \le 1$, $0 \le y \le 1$, $0 \le x+y \le 1$). The second conductivity-type semiconductor layer may be composed of at least one of GaN, InN, AlN, InGaN, AlGaN, InAlGaN, AlInN, AlGaAs, InGaAs, AlInGaAs, GaP, AlGaP, InGaP, AlInGaP and InP. Although the second conductivity-type semiconductor layer may include, for example, a p-type dopant such as Mg, Zn, Ca, Sr or Ba, the disclosure is not limited thereto.

The light-emitting device 120 may take the form of a light-emitting diode chip. Furthermore, although the light-emitting device 120 may take the form of a package in which at least one light-emitting diode is mounted on a body, the embodiments are not limited thereto.

In the case in which the light-emitting device 120 is constituted by a light-emitting diode chip and a body, the body may serve to protect the light-emitting diode chip from the outside. In the case in which the body includes a lead frame, the light-emitting diode chip may be placed on the lead frame so as to electrically connect the light-emitting device 120 to an external device.

In this case, the lead frame, which is connected to the light-emitting diode chip, may include two lead frames having different polarities.

The lead frame may include metal, for example, at least one selected from among titanium (Ti), copper (Cu), Nickel (Ni), Gold (Au), Chrome (Cr), Tantalum (Ta), Platinum (Pt), Tin (Sn), Silver (Ag), Phosphorous (P), Aluminum (Al), Indium (In), Palladium (Pd), Cobalt (Co), Silicon (Si), Germanium (Ge), Hafnium (Hf), Ruthenium (Ru) and Iron (Fe), or an alloy thereof. The lead frame may be formed to have a single layer structure or a multi-layered structure, without being limited thereto.

In the embodiment, the lens 130 may be disposed above the light-emitting device 120.

The lens 130 may be disposed so as to be spaced apart from the light-emitting device 120. The lens 130 may receive light from the light-emitting device 120. The lens 130 may control the direction angle of the light received from the light-emitting device 120. The lens 130 may determine the direction in which light is radiated from the light-emitting device package 100.

The lens 130 may include a material through which light is transmitted.

The lens 130 may have the first recess 133 formed in the upper surface 134 thereof, and the first recess 133 may be a depressed portion of the upper surface 134 of the lens 130. For example, the first recess 133 in the upper surface 134 may take a form in which the center region of the lens 130 is depressed.

The upper surface 134 of the lens 130, which has the therein first recess 133, may be the light-emitting surface from which light is emitted.

The upper surface 134 may have a curvature. The upper surface 134 may change the travelling direction of the light emitted from the light-emitting device 120. The upper surface 134 of the lens 130, which has the curvature, may mitigate a phenomenon whereby light is concentrated upward in the vertical direction of the light-emitting device 120.

For example, the upper surface 134 of the lens 130 according to the embodiment may be a surface which is defined by a curved line having a curvature that encircles an imaginary line Z that extends through the center of the lens 130.

The vertical section of the upper surface 134 may have the shape of a curved line, which rises with a predetermined curvature from the center of the lower end of the lens 130, and may be symmetric at both sides thereof with respect to the imaginary vertical line Z.

For example, the imaginary figure, which is defined by a curved line corresponding to the contour of the upper surface 134 of the lens 130, which is rotated about the imaginary vertical line z that extends through the center of the lens 130, may increase in horizontal surface area with increasing distance upward from the bottom surface of the lens 130.

The lens 130 may have a circular horizontal section.

In the embodiments illustrated in FIGS. 1*a* and 1*b*, the upper surface 134 of the lens 130 may be provided in at least a portion thereof with the groove 132.

The groove 132 may have one or more inclined surfaces 138*a* and 138*b*. The inclined surfaces 138*a* and 138*b* may be inclined in the radial direction of the lens from the center of the groove 132. Although the inclined surfaces 138*a* and 138*b* may be inclined toward the upper end of the groove 132 from the lower end of the center of the groove 132, the disclosure is not limited thereto.

For example, the groove 132 may include a first inclined surface 138*a*, which is inclined toward the center of the lens 130 from the center of the groove 132, and a second inclined surface 138*b*, which is inclined in the outward direction of the lens 130 from the center of the groove 132.

In the case in which the groove 132 has the two inclined surfaces 138*a* and 138*b*, the two inclined surfaces 138*a* and 138*b* may be inclined so as to face each other.

The width d of the groove 132 may be within a range of 5% to 10% of the radius r of the bottom surface 150 of the lens 130. If the width d of the groove 132 is less than 5% of the radius r of the bottom surface 150 of the lens 130, an effect of alleviating the phenomenon whereby light is excessively concentrated on the upper end of the upper surface 134 may be insufficient. If the width d of the groove 132 is greater than 10% of the radius r of the bottom surface 150 of the lens 130, the amount of light that is emitted to the outside may be reduced, thereby lowering light extraction efficiency.

The vertical height h of the groove 132 may be within a range of 5% to 10% of the height H between the bottom surface of the lens 130 and the upper end of the lens 130. Here, the vertical height h of the groove 132 may be the vertical height between the lower end of the groove 132 and the highest point at which the groove 132 meets the upper surface of the lens 130, and the height H of the lens 130 may be the vertical height between the bottom surface 150 of the lens 130 and the highest end of the lens 130.

If the height h of the groove 132 is less than 5% of the height H of the lens 130, the effect of alleviating the phenomenon whereby light is excessively concentrated on the upper end of the upper surface 134 may be insufficient. If the height h of the groove 132 is greater than 10% of the height H of the lens 130, the amount of light that is emitted to the outside may be reduced, thereby lowering light extraction efficiency.

The distance X1 between the center of the light-emitting device 120 and the groove 132 may be greater than the distance X2 between the center of the light-emitting device 120 and the support 136.

The center of the light-emitting device 120 may coincide with the center of the lens 130, and the imaginary line Z, which extends through the center of the lens 130, may extend through the center of the light-emitting device 120.

The lens 130 may include the support 136 adapted to support the lens 130.

The support 136 may be formed on the bottom surface of the lens 130, and may be disposed on an area of the board 110. The support 136 may be disposed so as to be spaced apart from the light-emitting device 120.

The lens 130 may be provided on the bottom surface thereof with a plurality of supports 136. For example, two supports 136 may be formed on the bottom surface 150 of the lens 130 such that they are disposed between the lens 130 and the board 110 so as to support the lens 130.

Furthermore, four supports 136 may also be formed on the bottom surface 150 of the lens 130 such that they are disposed at the corners of the board 110 so as to support the lens 130. The number of supports 136 and the area at which the supports 136 are disposed are not limited thereto, and may be variously modified.

The support 136 of the lens 130 may be formed so as to be spaced apart from the groove 132 formed in the upper surface 134 of the lens 130.

For example, when viewed from a cross-section of the lens 130, the groove 132 and the support 136 may be disposed so as not to overlap each other. The groove 132 may be disposed outside the support 136.

Since the groove 132 is positioned so as not to overlap the support 136, it is possible to prevent deterioration in light properties attributable to Mura of light emitted from the lens 130. The term "Mura" denotes defect involving a non-uniform display of a specific area of a screen when the entire screen is displayed at a constant gray scale. Furthermore, since the groove 132 is positioned outside the support 136, and light introduced into the lens 130 is refracted and emitted at the groove 132 formed in the marginal region of the lens 130, it is possible to prevent the occurrence of defective regions such as hot spots or blind spots.

The positional relationship between the groove 132 and the support 136 is not limited the embodiments illustrated in the drawings.

The groove 132 may be formed so as to contact the lateral side surface 135 of the lens 130.

The lateral side surface of the lens 130 may be formed to have an inclination. The lateral side surface 135 of the lens 130 may have a predetermined angle of inclination with respect to the bottom surface 150.

Although the lateral side surface 135 of the lens 130 may have, for example, an acute angle with respect to the bottom surface of the lens 130, the disclosure is not limited thereto. The overall lens 130 may take the form of a portion of a circular cone or an elliptical cone.

The angle of inclination between the lateral side surface 135 of the lens 130 and the bottom surface 150 of the lens 130 may be within a range of 70° to 80°.

If the angle of inclination of the lateral side surface 135 of the lens 130 is less than 70°, the extent to which light emitted from the light-emitting device 120 escapes in the lateral direction of the lens 130 may be increased, thereby making it difficult to maintain a reliable direction angle. If the angle of inclination of the lateral side surface 135 of the lens 130 is greater than 80°, the curvature of the upper surface 134 may be decreased, thereby making it difficult to form a light direction angle toward the upper surface 134.

The bottom surface 150 of the lens 130, which faces the light-emitting device 120, may have a greater width than the upper end of the lens 130.

When the lens 130 is viewed from above, the lens 130 may take a circular, elliptical or polygonal shape, and the cross-section of the lens 130 may also take a circular, elliptical or polygonal shape. The area of the upper end of the lens 130 may be less than that of the bottom surface of the lens 130.

The bottom surface 150 of the lens 130 may be provided with irregularities (not shown). By virtue of the irregularities on the bottom surface 150 of the lens 130, the light, which is reflected at the upper surface 134 of the lens 130 and is again introduced into the bottom surface 150, may undergo diffused reflection, and outward extraction of light from the lens 130 may be facilitated, thereby improving the light efficiency of the light-emitting device package.

Furthermore, since the bottom surface 150 of the lens 130 has an increased surface area due to the irregularities, there is an effect of improving heat dissipation when the temperature of the lens 130 is increased due to the introduction of light.

The bottom surface 150 of the lens 130 may further be provided with a reflector (not shown).

The reflector serves to reflect part of the light that has passed through the lens 130 and is directed toward the bottom surface 150, thereby improving light efficiency.

Referring to FIG. 1*a*, the bottom surface 150 of the lens 130 may further be provided with a second recess 151. The second recess 151 may be disposed at the central area of the bottom surface 150 of the lens 130. The vertical section of the second recess 151 may take a semicircular or semi-elliptical shape.

Although the second recess 151 may be formed by depressing the bottom surface 150 of the lens 130, that is, by making the bottom surface 150 that faces the light-emitting device 120 concave, the shape of the second recess 151 is not limited thereto.

FIGS. 1*b* to 5 are views illustrating cross-sections of light-emitting device packages according to embodiments. The embodiments will now be described with reference to the drawings. The following description will be concentrated on the difference between these embodiments and the embodiment illustrated in FIG. 1*a* without setting forth redundant descriptions of these embodiments, which would overlap the description regarding the embodiment illustrated in FIG. 1*a*.

In the embodiment illustrated in FIG. 1*b*, the upper surface 134 of the lens 130 may start from the bottom surface 150 of the lens 130. In the embodiment illustrated in FIG. 1*b*, the lower surface 150 of the lens 130 may not be provided with the second recess, unlike the embodiment illustrated in FIG. 1*a*.

For example, in the vertical section of the lens 130 illustrated in FIG. 1*b*, the curved line, which is defined by the upper surface 134 of the lens 130, may be bilaterally symmetrical with respect to an imaginary line Z that extends through the center of the lens 130, and may merge at the center point of the bottom surface 150 of the lens 130.

FIGS. 2 to 5 illustrate respective embodiments of the groove 132 in the light-emitting device package.

Referring to (a) and (b) of FIG. 2, the upper surface 134 of the lens 130 may be provided with a flat surface parallel to the bottom surface 150 of the lens 130.

In other words, one of the inclined surfaces 138*a* and 138*b* of the groove 132 in the upper surface 134 may be parallel to the bottom surface 150 of the lens 130.

For example, in (a) of FIG. 2, the second inclined surface 138*b*, which is one of the two inclined surfaces of the groove 132, may be parallel to the bottom surface 150, and the first inclined surface 138*a*, which is the other of the two inclined surfaces of the groove 132, may be inclined with respect to the second inclined surface 138*b*. Furthermore, the first inclined surface 138*a* may protrude upward from the second inclined surface 138*b*, which is parallel to the bottom surface 150.

In another embodiment, illustrated in (b) of FIG. 2, one of the two inclined surfaces of the groove 132 may be perpendicular to the bottom surface 150.

For example, in (b) of FIG. 2, the first inclined surface 138*a* of the groove 132 may be perpendicular to the bottom surface 150, and the second inclined surface 138*b* may be parallel to the bottom surface 150.

In the embodiments illustrated in (a) and (b) of FIG. 2, by virtue of formation of the groove 132 in the outer marginal region of the upper end of the lens 130, it is possible to prevent deterioration in light properties attributable to hot spots, blind spots or the like, which may occur at the outer marginal region of the upper end of the lens 130. In addition, by virtue of the inclined surface of the groove 132, which is parallel to the bottom surface 150, sharp protrusions which would otherwise be present at the edge of the lens 130 and eliminated, thereby making it easy to manufacture the lens.

Referring to FIG. 3, in the light-emitting device package according to a further embodiment, the first inclined surface 138*a* of the groove 132, which is disposed closer to the center of the lens 130, may be parallel to the bottom surface 150, unlike the embodiment illustrated in (a) of FIG. 2.

In the embodiment illustrated in FIG. 3, the second inclined surface 138*b*, which is disposed closer to the lateral side surface of the lens 130, may be formed so as to be inclined with respect to the first inclined surface 138*a*.

Referring to FIG. 4, the groove 132 may include a plurality of inclined surfaces having different heights.

For example, the groove 132 may include the first inclined surface 138*a*, which is inclined toward the center of the lens 130, and the second inclined surface 138*b*, which is inclined in the outward direction of the lens 130.

In the embodiment illustrated in FIG. 4, the vertical height b of the first inclined surface 138*a*, measured from the lower end to the upper end thereof, may be less than the vertical height a of the second inclined surface 138*b*, measured from the lower end to the upper end thereof.

Referring to FIG. 5, the groove 132 of the lens 130 may include the first inclined surface 138*a*, which is inclined toward the center of the lens 130, the second inclined surface 138*b*, which is connected to the first inclined surface 138*a* and is inclined in the outward direction of the lens 130, and a third inclined surface 138*c*, which is connected to the second inclined surface 138*b* and contacts the lateral side surface 135 of the lens 130. Here, the third inclined surface 138*c* may be parallel to the bottom surface 150 of the lens 130.

The third inclined surface 138*c* may be positioned at a higher level than the first inclined surface 138*a*. The first inclined surface 138*a* may be parallel to the bottom surface 150 of the lens 130. In this case, there is a difference in height between the upper end of the lens 130, which is defined by the first inclined surface 138*a*, and the upper end of the lens 130, which is defined by the third inclined surface 138*c*, and the third inclined surface 138*c* may be positioned at a higher level than the first inclined surface 138*a*.

The third inclined surface 138*c* may have a ring shape, when viewed from above.

The light-emitting device packages according to embodiments, which have been described with reference to FIGS. 1 to 5, are able to prevent deterioration in light properties attributable to Mura, hot spots, blind spots or the like during light emission by providing the upper end of the lens 130 with the groove 132, thereby improving light distribution properties.

The light-emitting device package 100 according to any of the above embodiments may contribute to the realization of a display apparatus, an indicating apparatus, a lighting apparatus or the like. Although the display apparatus and the lighting apparatus, which will now be described with reference to the drawings, may be one example of a lighting system, the disclosure is not limited thereto.

FIG. 6 is an exploded perspective view of a display apparatus including the light-emitting device packages according to an embodiment.

Referring to FIG. 6, the display apparatus 1000 according to the embodiment includes a light guide plate 1041, a light source module 1031 for supplying light to the light guide plate 1041, a reflecting member 1022 disposed below the light guide plate 1041, an optical sheet 1051 disposed above the light guide plate 1041, a display panel 1061 disposed above the optical sheet 1051, and a bottom cover 1011 for accommodating the light guide plate 1041, the light source module 1031 and the reflecting member 1022, without being limited thereto.

The bottom cover 1011, the reflecting sheet 1022, the light guide plate 1041 and the optical sheet 1051 may be defined as a light unit 1050.

The light guide plate 1041 functions to diffuse light so as to serve as a surface light source. The light guide plate 1041 may be made of a transparent material, for example, one of acrylic resin such as polymethylmethacrylate (PMMA); polyethylene terephthalate (PET); polycarbonate (PC); cycloolefin copolymer (COC) and polyethylene naphthalate (PEN).

The light source module 1031 supplies light to at least one surface of the light guide plate 1041, and eventually serves as the light source of the display apparatus.

The light source module 1031 may include at least one light source module, and may directly or indirectly supply light to one surface of the light guide plate 1041. The light source module 1031 may include a board 1033 and the light-emitting device packages 1035 according to the above-described embodiments. The light-emitting devices 1035 may be arranged on the board 1033 at predetermined intervals.

The board 1033 may be a printed circuit board (PCB) including a circuit pattern (not shown). However, the board 1033 may include not only a general PCB but also a metal-core PCB (MCPCB), a flexible PCB (FPCB) or the like, without being limited thereto. In the case in which the light-emitting device packages 1035 are mounted on the lateral side surface of the bottom cover 1011 or on a heat dissipation plate, the board 1033 may be eliminated. A portion of the heat dissipation plate may be in contact with the upper surface of the bottom cover 1011.

The plurality of light-emitting device packages 1035 may be mounted on the board 1033 such that the light-emitting surfaces thereof are spaced apart from the light guide plate 1041 by a predetermined distance, without being limited thereto. The light-emitting device packages 1035 may directly or indirectly supply light to a light-introducing portion, which is one surface of the light guide plate 1041, without being limited thereto.

The reflecting member 1022 may be disposed below the light guide plate 1041. The reflecting member 1022 may reflect light, which is introduced into the lower surface of the light guide plate 1041, upward, thereby increasing the luminance of the light unit 1050.

Although the reflecting member 1022 may be made of PET, PC, PVC, resin or the like, the disclosure is not limited thereto. The reflecting member 1022 may be the upper surface of the bottom cover 1011, without being limited thereto.

The bottom cover 1011 may accommodate the light guide plate 1041, the light source module 1031, the reflecting member 1022 and the like. To this end, the bottom cover 1011 may include an accommodating portion, which has the form of a box having an open upper surface, without being limited thereto. The bottom cover 1011 may be coupled to a top cover, without being limited thereto.

The bottom cover 1011 may be made of a metal or resin material, and may be manufactured through an appropriate process such as press working or extrusion molding. Furthermore, the bottom cover 1011 may contain a metal or non-metal material having excellent heat conductivity, without being limited thereto.

The display panel 1061, which is embodied as, for example, an LCD panel, includes first and second substrates, which face each other and are made of a transparent material, and a liquid crystal layer disposed between the first and second substrates. At least one surface of the display panel 1061 may be provided with a polarization plate attached thereto, without being limited thereto. The display panel 1061 displays information using light passing through the optical sheet 1051. The display apparatus 1000 may be applied to various portable terminals, a monitor for a notebook computer, a monitor for a laptop computer, a television monitor or the like.

The optical sheet 1051 is disposed between the display panel 1061 and the light guide plate 1041, and includes at least one light-transmissive sheet. The optical sheet 1051 may include, for example, one of various sheets such as a diffusion sheet, a horizontal and vertical prism sheet, a luminance-intensifying sheet and the like. The diffusion sheet serves to diffuse incident light, the horizontal and vertical prism sheet serves to concentrate incident light on a display area, and the luminance-intensifying sheet serves to reuse lost light so as to increase luminance. The display panel 1061 may be provided thereon with a protective sheet, without being limited thereto.

The optical path of the light source module 1031 may be provided with the light guide plate 1041 and the optical sheet 1051, without being limited thereto.

FIG. 7 is a view illustrating a display apparatus including the light-emitting device packages according to an embodiment.

Referring to FIG. 7, the display apparatus 1100 includes a bottom cover 1152, a board 1120 on which the above-described light-emitting devices 1124 are arranged or the light-emitting device packages according to the embodiment, an optical member 1154 and a display panel 1155.

The board 1120 and the light-emitting device packages 1124 may be defined as a light source module 1160. The bottom cover 1152, at least one light source module 1160 and the optical member 1154 may be defined as a light unit. The bottom cover 1152 may have an accommodating portion 1153, without being limited thereto. The light source module 1160 includes the board 1120 and the plurality of light-emitting device packages 1124 arranged on the board 1120.

The optical member 1154 may include at least one of a lens, a light guide plate, a diffusion sheet, a horizontal and vertical prism sheet and a luminance-intensifying sheet. The light guide plate may be made of PC or polymethyl methacrylate (PMMA), and may alternatively be eliminated. The diffusion sheet serves to diffuse incident light, the horizontal and vertical prism sheet serves to concentrate incident light on a display area, and the luminance-intensifying sheet serves to reuse lost light so as to increase luminance.

The optical member 1154 is disposed on the light source module 1160 so as to convert the light emitted from the light source module 1160 into a surface light source, perform diffusion, concentrate the light and the like.

FIG. 8 is an exploded perspective view of a lighting apparatus including the light-emitting device package according to an embodiment.

Referring to FIG. 8, the lighting apparatus according to the embodiment may include a cover 2100, a light source module 2200, a heat radiator 2400, a power supply 2600, an inner case 2700 and a socket 2800. The lighting apparatus according to the embodiment may further include one or more of a member 2300 and a holder 2500. The light source module 2200 may include the light-emitting device according to the embodiment.

For example, the cover 2100 may have a hollow bulb or a hollow hemispherical shape, and may be open at a portion thereof. The cover 2100 may be optically coupled to the light source module 220. For example, the cover 2100 may defuse, scatter or excite light provided from the light source module 2200. The cover 2100 may be a kind of optical member. The cover 2100 may be coupled to the heat radiator 2400. The cover 2100 may include a coupler for coupling to the heat radiator 2400.

The cover 2100 may be coated on the inner surface thereof with milky white paint. The milky white paint may include a diffusing material for diffusing light. The surface roughness of the inner surface of the cover 2100 may be higher than the surface roughness of the outer surface of the cover 2100. The reason for this is to sufficiently scatter and diffuse light emitted from the light source module 2200 and emit the light to the outside.

The cover 2100 may be made of glass, plastic, polypropylene (PP), polyethylene (PE), polycarbonate (PC) or the like. Among these, polycarbonate is excellent in light resistance, heat resistance, and strength. The cover 2100 may be transparent so as to allow the light source module 220 to be visible from the outside, or may be opaque. The cover 2100 may be manufactured through blow molding.

The light source module 2200 may be disposed on one surface of the heat radiator 2400. Accordingly, heat from the light source module 2200 may be transferred to the heat radiator 2400. The light source module 2200 may include a connecting plate 2230 and a connector 2250, and may include the light-emitting device according to the above-described embodiment.

The member 2300 is disposed on the upper surface of the heat radiator 2400, and may have a guide recess 2310 in which a plurality of light-emitting device packages 2210 and the connector 2250 are received. The guide recess 2310 corresponds to the boards of the light-emitting device packages and the connector 2250.

The surface of the member 2300 may have a light reflective material applied or coated thereon. The member 2300 reflects the light, which is reflected at the inner surface of the cover 2100 and is returned back to the light source module 2200, toward the cover 2100. Consequently, it is possible to improve the light efficiency of the lighting apparatus according to the embodiment.

The member 2300 may be made of, for example, an insulation material. The connecting plate 2230 of the light source module 2200 may include an electric conductive material. Accordingly, the heat radiator 2400 may be in electric contact with the connecting plate 2230. The member 2300 may be made of an insulation material so as to prevent an electric short between the connecting plate 2230 and the heat radiator 2400. The heat radiator 2400 radiates the heat from the light source module 2200 and the heat from the power supply 2600.

The holder 2500 blocks receiving grooves 2719 of an insulator 2710 of the inner case 2700. Accordingly, the power supply 2600 received in the insulator 2710 of the inner case 2700 is tightly closed. The holder 2500 includes a guide protrusion 2510. The guide protrusion 2510 may have a hole through which a protrusion of the power supply 2600 passes.

The power supply 2600 processes or converts electric signals received from the outside, and provides the processed electric signals to the light source module 2200. The power supply 2600 is received in the receiving grooves 2719 in the inner case 2700, and is hermetically contained in the inner case 2700 by the holder 2500.

The power supply 2600 may include the protrusion 2610, a guide portion 2630, a base 2650 and a protrusion 2670.

The guide portion 2630 is configured to protrude outward from a portion of the base 2650. The guide portion 2630 may be fitted into the holder 2500. The base 2650 may be provided on one surface thereof with a plurality of components. The plurality of components may include a DC transducer for converting AC power, supplied from an external power source, into DC power, a driving chip for controlling driving of the light source module 2200, an electro static discharge (ESD) unit for protecting the light source module 2200 and the like, without being limited thereto.

The protrusion 2670 is configured to protrude outward from another portion of the base 2650. The protrusion 2670 is fitted into a connector 2750 of the inner case 2700, and receives electric signals from the outside. In an example, the protrusion may have a width equal to or less than the width of the connector 2750 of the inner case 2700. The protrusion 2670 may be electrically connected to first ends of a "+ polarity electric wire" and a "− polarity electric wire", and the socket 2800 may be electrically connected to the second ends of the "+ polarity electric wire" and the "− polarity electric wire".

The inner case 2700 may contain therein a molding portion along with the power supply 2600. The molding portion, which is solidified molding liquid, serves to hold the power supply 2600 in the inner case 2700.

The light-emitting devices according to the embodiments are not limited to the constructions and ways of the above-described embodiments, and all of some of the embodiments may be selectively combined with each other such that the embodiments are variously modified.

Generally used terms, such as those defined in commonly used dictionaries, should be interpreted as having a meaning that is consistent with their meaning in the context of the relevant art, and will not be interpreted in an idealized or overly formal sense unless expressly so defined herein.

Unless otherwise defined, all terms including technical and scientific terms used herein have the same meaning as commonly understood by one of ordinary skill in the art to which the embodiments belong.

Since terms, such as "include", "comprise" or "have", means that the component of interest may be included unless otherwise indicated, the term should be construed as including another component rather than excluding the component.

Although preferred embodiments have been illustrated and described, it should be understood that this disclosure is not limited the above-described specific embodiments, and numerous other modifications and embodiments can be devised by those skilled in the art to which this disclosure belongs without departing from the spirit and scope of this disclosure as defined by the appended claims. Furthermore, these modifications and embodiments should not be separately understood from the spirit and scope of this disclosure.

INDUSTRIAL APPLICABILITY

The light-emitting device packages according to the embodiments may be incorporated in display apparatuses and lighting apparatuses so as to uniformly emit light in the direction of the upper end of the lens.

The invention claimed is:

1. A light-emitting device package comprising:

a light-emitting device disposed on a board having an electrode pattern for supplying power to the light-emitting device; and a lens disposed on the light-emitting device, wherein the lens comprises:

an upper surface having a first recess;

a groove formed in at least a portion of the upper surface;

a bottom surface facing the light-emitting device;

a plurality of supports disposed on the bottom surface and extending between the bottom surface and the board, the plurality of supports being configured to support the lens on the board; and a single continuous planar surface, wherein the groove is in contact with an edge of the first recess, and, when viewed from a cross-section of the lens, the groove and each of the supports are disposed not to overlap each other in a vertical direction, wherein the groove is disposed at an outer region of the lens, which is located at a position further outward than the plurality of supports from the light-emitting device, wherein the groove comprises:

a first surface being parallel to an entire bottom surface of the lens and located further away from the center of the lens than the plurality of supports; and a second surface inclined with respect to the first surface and extending from the first surface to the single continuous planar surface, wherein the single continuous planar surface is inclined towards a center of the lens from the bottom surface to the second surface, wherein the first surface is disposed between the first recess and the second surface, wherein the bottom surface is the widest surface of the lens and is provided without a recess, and wherein the single continuous planar surface is inclined at an angle of 70° to 80° relative to the bottom surface.

2. The light-emitting device package according to claim 1, wherein a vertical cross-section of the first recess rises from the center of the lens proximate the bottom surface to an upper direction of the lens with a curvature.

3. The light-emitting device package according to claim 1, wherein the second surface is inclined in an outward direction of the lens.

4. The light-emitting device package according to claim 1, wherein a vertical height between the bottom surface of the lens and an upper end of the first surface is smaller than a vertical height between the bottom surface of the lens and an upper end of the second surface.

5. The light-emitting device package according to claim 1, wherein the single continuous planar surface has a predetermined gradient from the groove to the bottom surface.

6. A light-emitting device package comprising:

a light-emitting device disposed on a board having an electrode pattern for supplying power to the light-emitting device; and a lens disposed on the light-emitting device, wherein the lens comprises:

an upper surface having a first recess;

a groove formed adjacent to the first recess;

a bottom surface facing the light-emitting device;

a plurality of supports disposed on the bottom surface and extending between the bottom surface and the board, the plurality of supports being configured to support the lens on the board; and a single continuous planar surface inclined towards a center of the lens from the bottom surface to a topmost surface of the lens, wherein the groove is in contact with an edge of the first recess and, when viewed from a cross-section of the lens, the groove and each of the supports are disposed not to overlap each other in a vertical direction, wherein the topmost surface is located between the groove and the single continuous planar surface, wherein the groove includes a first surface and a second surface, wherein each of the first surface and the topmost surface of the lens is parallel to an entire bottom surface of the lens, wherein the second surface is inclined with respect to the first surface and the topmost surface of the lens and the second surface is located between the first surface and the topmost surface of the lens, wherein the single continuous planar surface contacts the topmost surface of the lens, wherein the bottom surface is the widest surface of the lens and is provided without a recess, and wherein the single continuous planar surface is inclined at an angle of 70° to 80° relative to the bottom surface.

7. The light-emitting device package according to claim 6, wherein a distance between the light emitting device and the topmost surface of the lens is greater than a distance between the light emitting device and the plurality of supports.

8. The light-emitting device package according to claim 6, wherein in a vertical cross-section, the first recess extends from the center of the lens proximate to the bottom surface to the first surface of the groove with a curvature.

9. The light-emitting device package according to claim 6, wherein in a vertical cross-section, the second surface rises from the first surface to the topmost surface of the lens.

10. The light-emitting device package according to claim 6, wherein a vertical height between the bottom surface of the lens and the first surface is less than a vertical height between the bottom surface of the lens and the topmost surface.

* * * * *